United States Patent
Grez

(10) Patent No.: US 11,311,098 B2
(45) Date of Patent: Apr. 26, 2022

(54) HAIR COLORING APPLIANCE

(71) Applicant: L'Oréal, Paris (FR)

(72) Inventor: Joseph Grez, North Bend, WA (US)

(73) Assignee: L'Oreál, Paris (FR)

(*) Notice: Subject to any disclaimer, the term of this patent is extended or adjusted under 35 U.S.C. 154(b) by 511 days.

(21) Appl. No.: 15/339,551

(22) Filed: Oct. 31, 2016

(65) Prior Publication Data

US 2018/0116363 A1 May 3, 2018

(51) Int. Cl.

| | |
|---|---|
| *A46B 13/04* | (2006.01) |
| *A45D 24/28* | (2006.01) |
| *A46B 9/02* | (2006.01) |
| *B23K 26/0622* | (2014.01) |
| *B23K 26/064* | (2014.01) |
| *A45D 24/22* | (2006.01) |
| *B23K 26/067* | (2006.01) |
| *A45D 19/02* | (2006.01) |
| *A45D 19/00* | (2006.01) |

(Continued)

(52) U.S. Cl.
CPC ............ *A46B 13/04* (2013.01); *A45D 19/012* (2021.01); *A45D 19/02* (2013.01); *A45D 24/22* (2013.01); *A45D 24/28* (2013.01); *A46B 9/023* (2013.01); *B23K 26/064* (2015.10); *B23K 26/067* (2013.01); *B23K 26/0622* (2015.10); *B23K 26/0673* (2013.01); *B23K 26/382* (2015.10); *G02F 1/33* (2013.01); *H01S 3/0085* (2013.01); *H01S 3/2232* (2013.01); *H05K 3/0026* (2013.01); *A45D 19/0083* (2021.01); *A45D 19/022* (2021.01); *A45D 2019/0033* (2013.01); *A45D 2200/058* (2013.01); *B23K 2101/42* (2018.08); *G02F 2203/26* (2013.01); *H05K 2203/107* (2013.01)

(58) Field of Classification Search
CPC ........ A45D 24/26; A45D 24/18; A45D 24/22; A45D 24/28; A45D 2019/0033; A45D 2019/0041; A45D 19/02; A45D 24/24; A45D 19/0008; A45D 2200/102; A45D 2200/1053; A45D 2200/106; A45D 2200/104; A45D 2/002; A46B 13/04; A46B 13/00; A46B 13/02; A01K 13/003
USPC .......................... 132/112, 113, 114, 115, 116
See application file for complete search history.

(56) References Cited

U.S. PATENT DOCUMENTS 1,818,281 A * 8/1931 Soss ...................... A46B 11/066
                                                    15/22.1
5,443,321 A * 8/1995 Dolan .................. A01K 13/002
                                                    132/112

(Continued)

FOREIGN PATENT DOCUMENTS

GB         1208149         * 6/1968

*Primary Examiner* — Cris L. Rodriguez
*Assistant Examiner* — Brianne E Kalach
(74) *Attorney, Agent, or Firm* — Clark A. Puntigam; Jensen & Puntigam P.S.

(57) ABSTRACT

A hair coloring appliance includes a handle and a hair color delivery system supported within the handle. A nozzle assembly is adapted to receive hair color. The nozzle assembly includes a stationary frame and a nozzle array through which the hair color is delivered to the hair and a plurality of filaments adjacent the nozzles which are longer than the nozzles, acting as a stand-off between the nozzles and the scalp. A motor reciprocates the nozzle array back and forth as hair color moves through the nozzles.

20 Claims, 12 Drawing Sheets

(51) Int. Cl.
*B23K 26/382* (2014.01)
*G02F 1/33* (2006.01)
*H01S 3/00* (2006.01)
*H01S 3/223* (2006.01)
*H05K 3/00* (2006.01)
*B23K 101/42* (2006.01)

(56) References Cited

U.S. PATENT DOCUMENTS

| | | | | | |
|---|---|---|---|---|---|
| 5,482,058 A | * | 1/1996 | Garconnet | | A45D 24/26 |
| | | | | | 132/115 |
| 5,839,451 A | * | 11/1998 | Dorber | | A45D 20/12 |
| | | | | | 132/271 |
| 5,937,865 A | * | 8/1999 | Dhaliwal | | A45D 24/28 |
| | | | | | 132/112 |
| 6,513,534 B1 | * | 2/2003 | Sofer | | A45D 24/28 |
| | | | | | 132/112 |
| 8,220,469 B1 | * | 7/2012 | Spagnuolo | | A45D 19/02 |
| | | | | | 132/114 |
| 9,364,068 B2 | * | 6/2016 | Kodama | | A45D 19/02 |
| 2005/0133055 A1 | * | 6/2005 | Stankovic | | A46B 11/0062 |
| | | | | | 132/116 |
| 2005/0199254 A1 | * | 9/2005 | Kang | | B65D 83/0016 |
| | | | | | 132/114 |
| 2006/0058714 A1 | * | 3/2006 | Rhoades | | A45D 24/007 |
| | | | | | 601/73 |
| 2011/0041864 A1 | * | 2/2011 | Kalman | | A45D 24/10 |
| | | | | | 132/120 |
| 2011/0067717 A1 | * | 3/2011 | McHugh | | A01K 13/002 |
| | | | | | 132/114 |
| 2014/0096786 A1 | * | 4/2014 | Nuzzo | | A45D 7/00 |
| | | | | | 132/207 |
| 2016/0045081 A1 | * | 2/2016 | Kern | | A46D 1/0238 |
| | | | | | 15/22.4 |
| 2017/0135463 A1 | * | 5/2017 | Matrullo | | A46B 13/02 |

\* cited by examiner

HAIR COLORING APPLIANCE

TECHNICAL FIELD

This invention relates generally to a hair coloring appliances, and more specifically concerns such an appliance which includes a reciprocating set of hair coloring dispensing nozzles.

BACKGROUND OF THE INVENTION

Home hair coloring sets, including brushes and other accessories, have been widely used by home users, typically as an economical way to achieve a hair coloring change or to cover undesired gray areas. While thus enabling home users to color their hair, such hair coloring sets have several known disadvantages. First, it takes a long time to achieve the coloring, including typically five minutes to set up the coloring materials, 10-30 minutes to apply the hair coloring first to the hair roots, followed by developing time, followed by pull-through of about five minutes of the remaining hair for coloring thereof from the roots to the hair ends, and then at least 10 minutes before the hair can be washed, for a total time of anywhere from 50-70 minutes, or even greater, depending on hair length.

Further, home hair coloring is often a messy process, both in the color application and clean-up. All the individual components and accessories of the set must then be carefully disposed of.

Still further, there is often difficulty in achieving uniformity of color coverage of the hair, such that the final result is often unsatisfactory, particularly when compared to a professional application by a trained stylist.

Accordingly, the present invention is directed toward solving one or more of the disadvantages set forth above.

SUMMARY OF THE INVENTION

Accordingly, the appliance comprises: a handle; a cosmetic composition delivery system, supported within the handle; a nozzle assembly includes a nozzle away, which includes a plurality of nozzles through which the cosmetic composition is directed; and a motor for moving the nozzle array, reciprocating back and forth, delivering the cosmetic composition as the appliance is pulled through the hair by the user.

BEST MODE FOR CARRYING OUT THE INVENTION

Home hair coloring involves two treatment stages. In a first stage, the hair roots are treated, followed by a developing time. In a second stage, the hair from beyond the roots to the hair ends is treated, referred to, respectively, as roots treatment and ends treatment.

Figure 1:
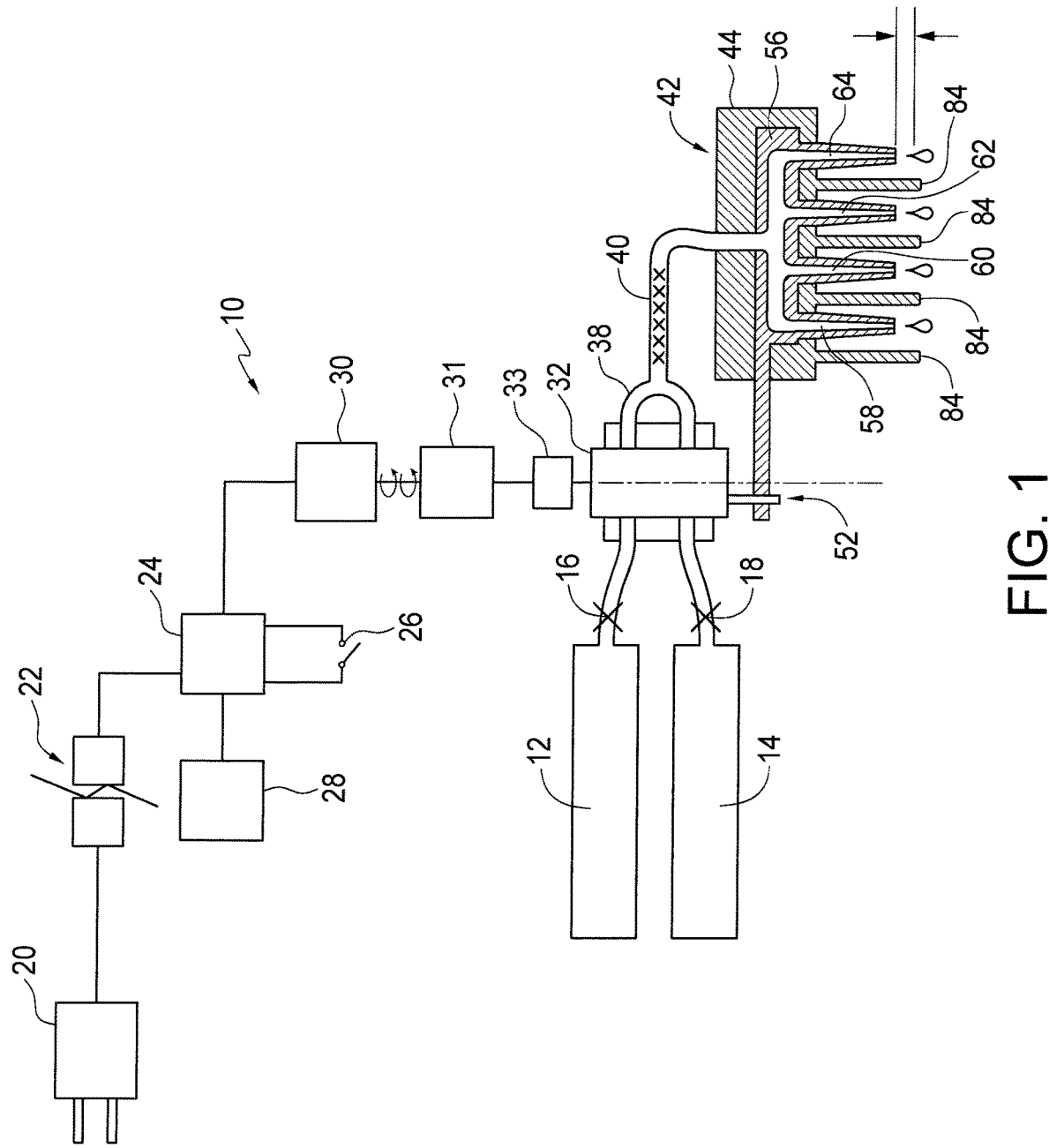
FIG. 1 is a block diagram of the complete appliance without the handle in which it is contained, including the coloring pump.

The appliance of the present invention includes a handle in which is positioned a hair coloring system. The coloring system is shown in block diagram form in FIG. 1. The system shown generally at 10 includes a collapsible reservoir 12 for a selected color and a collapsible reservoir 14 for a developer. The reservoirs have closures 16, 18, respectively, which are opened in use of the appliance.

The appliance includes a wall battery charger 20 which is connected to a charge connecter assembly 22, the output of which is connected to a controller 24, which has an appliance on/off switch 26. The appliance operates from a battery 28 which charges when the charger is plugged to the wall. The controller, which operates the appliance, connects to a motor 30, which connects through a gear reducer 31 and a coupling 33 to a rotor fluid pump 32, to which fluid lines 16, 18 from the reservoirs are connected. The rotor pump moves the fluids to a fluid combiner 38 and then to a static mixer 40, which in the embodiment shown are located outside of a nozzle assembly 42.

Figure 2:
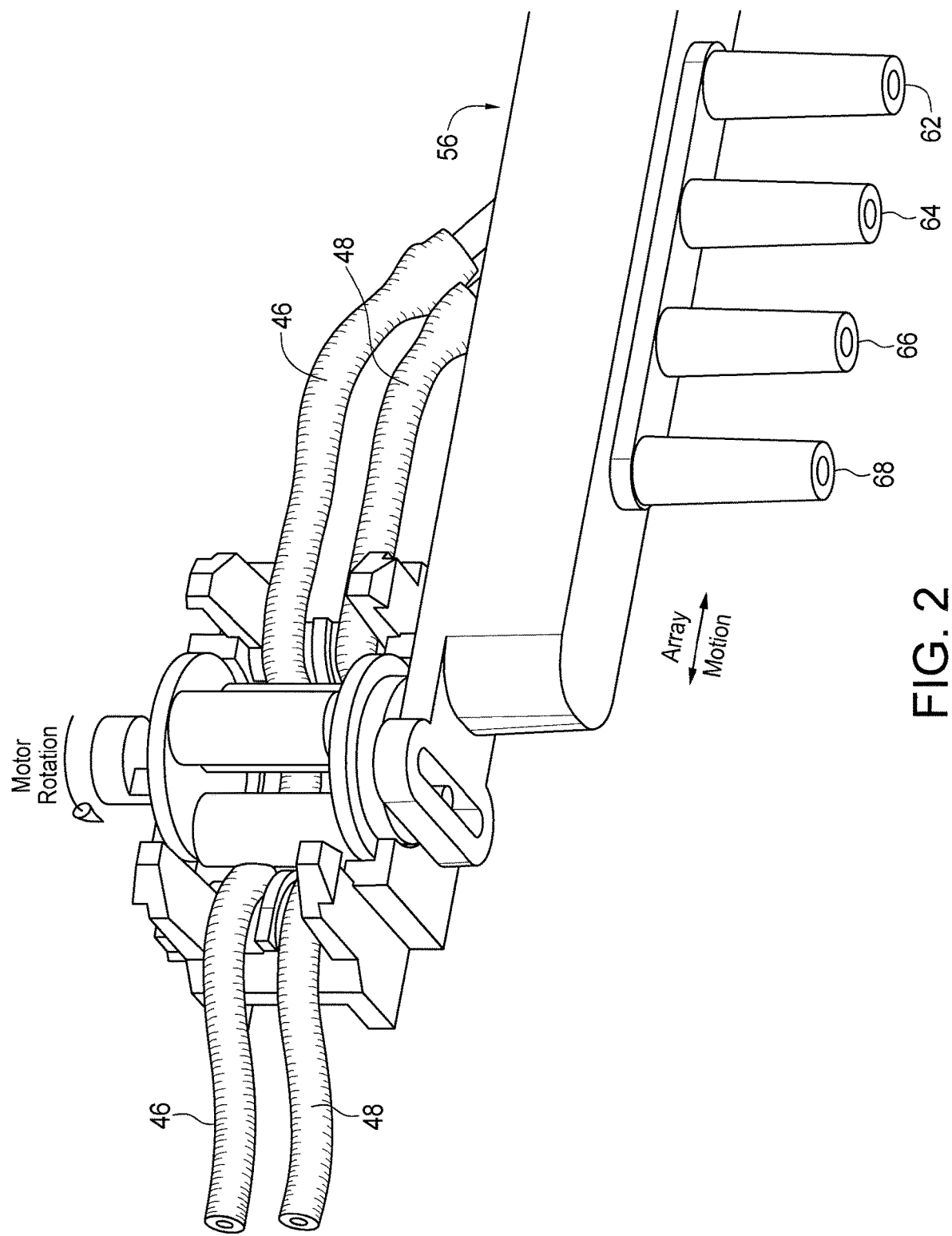
FIG. 2 is a schematic drawing of a portion of the nozzle and pump assembly of the system of FIG. 1.
Figure 3:
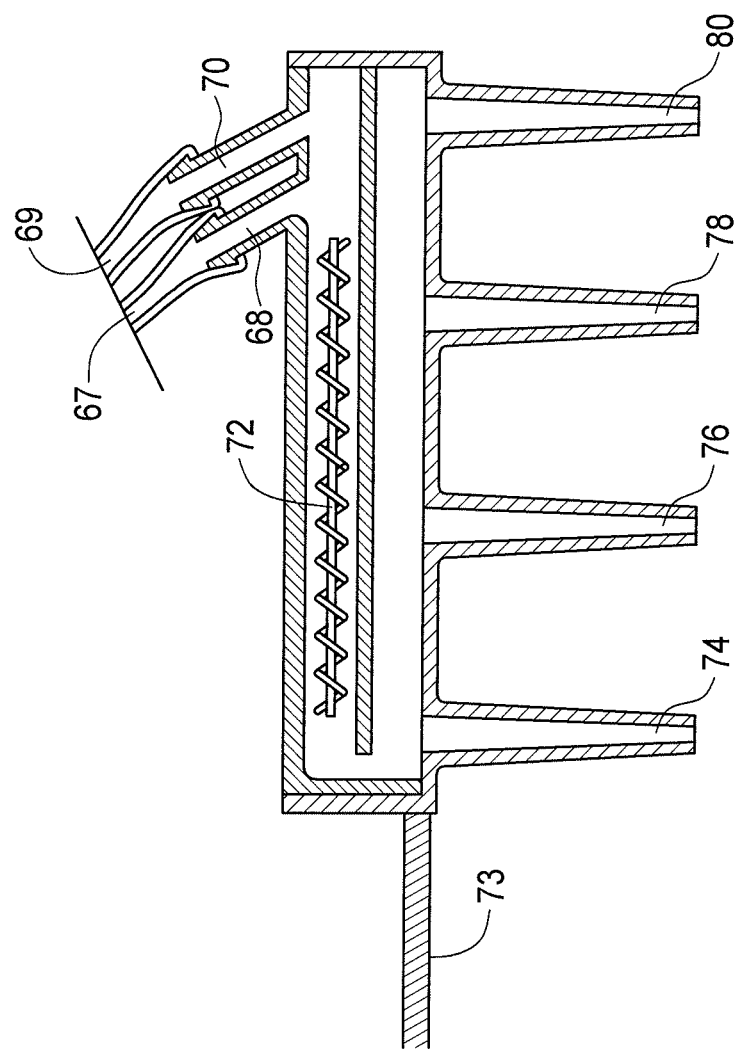
FIG. 3 is a longitudinal cross-section of the nozzle array.

In the embodiment shown, nozzle assembly 42 includes a static (non-moving) frame or base 44. Movably supported within the frame 44 is a nozzle array 56. The movement of the nozzle array is accomplished by means of a scotch yoke slot and pin arrangement 57, which in operation moves the nozzle array in a reciprocating manner, back and forth, over a selected distance, i.e. amplitude. The rotor/pump structure is shown in more detail in FIG. 2. In FIG. 2, the lines from the color reservoir and the developer reservoir are shown at 46 and 48, which continue to the nozzle array 56. The rotor/pump rotates as shown (FIG. 2) and in cooperation with a scotch yoke slot and pin arrangement 57 (FIG. 1) results in the nozzle array 56 moving horizontally, again as shown in FIG. 2. The nozzle array includes a plurality, typically four of, individual nozzles 58, 60, 62 and 64. One embodiment of the nozzle array is shown in more detail in FIG. 3. The coloring material and the developer are directed to the nozzle array by flexible pump tubes 67, 69 through openings 68 and 70 top part of the array and are mixed by a static mixer 72 in an upper part of the array. The array is sealed at 71 around its perimeter in the nozzle frame. The seal can be a weld or glue or a tight fit. The scotch yoke extension is shown at 73. The mixed color/developer is directed to a lower portion of the upper part of the array and through the individual nozzles 74, 76, 78 and 80.

Referring again to FIG. 1, the moveable nozzle array 56 is positioned in the nozzle frame or base 44. Extending downwardly from the nozzle base on opposing sides of the line of nozzles, flanking the nozzles, is a set or line of filaments 84-84. The filaments stay stationary as does the nozzle base 44 in operation, and flank the moving nozzle array. The filaments sequester or contain hair between the filaments. In the embodiment shown, the filaments are typical brush filaments, similar to that in a hair brush or comb. In the embodiment shown, the filaments have a ball end, with a radius less than 1 mm, although a ball end is not necessary. The filaments extend below the lower edge of the nozzles by a distance of approximately 0.050 inches in the embodiment shown, providing a stand-off for the nozzles from the scalp, as the ends of the filaments contact the scalp in operation.

Figure 4:
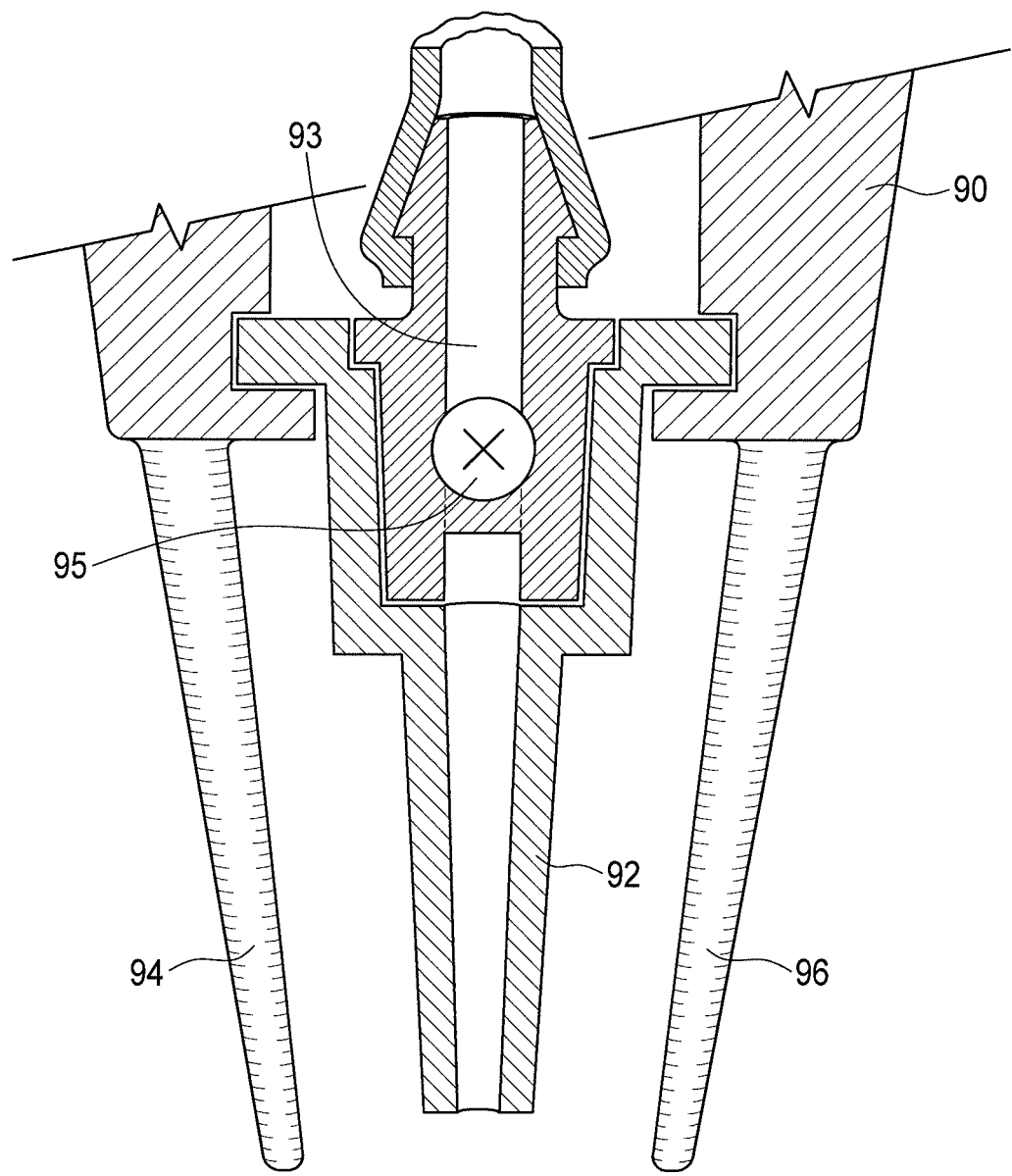
FIG. 4 is a lateral cross-section of the nozzle array of the nozzle assembly.

FIG. 4 shows a cross-section of the nozzle assembly. It shows a frame/base member 90 and one nozzle 92. Connected to the nozzle is a channel 93 leading from the colorant and developer pump tubes (one behind the other) to the static mixer 95. Flanking the nozzle are two filaments 94 and 96, on opposing sides of the nozzle. Although filaments on opposing, flanking sides of the nozzles are preferred, it is possible to use filaments on only one side of the nozzles, or in some cases, the filaments can be eliminated. As indicated above, this arrangement is used for coloring the roots of the hair which is approximately the first cm or so of the hair from the scalp. The spacing between successive individual nozzles is important, relative to the amplitude of movement of the moving nozzle portion. The amplitude must not be smaller than the center-to-center nozzle spacing, as indicated above. In order to obtain full coverage, it is possible for the amplitude to be somewhat larger. Also, as indicated above, in the embodiment shown, the filaments extend below the nozzles, ensuring that the scalp is not contacted by the moving nozzles, which can result in irritation and possible excessive absorption of the colorant/developer mix by the scalp.

Figure 5:
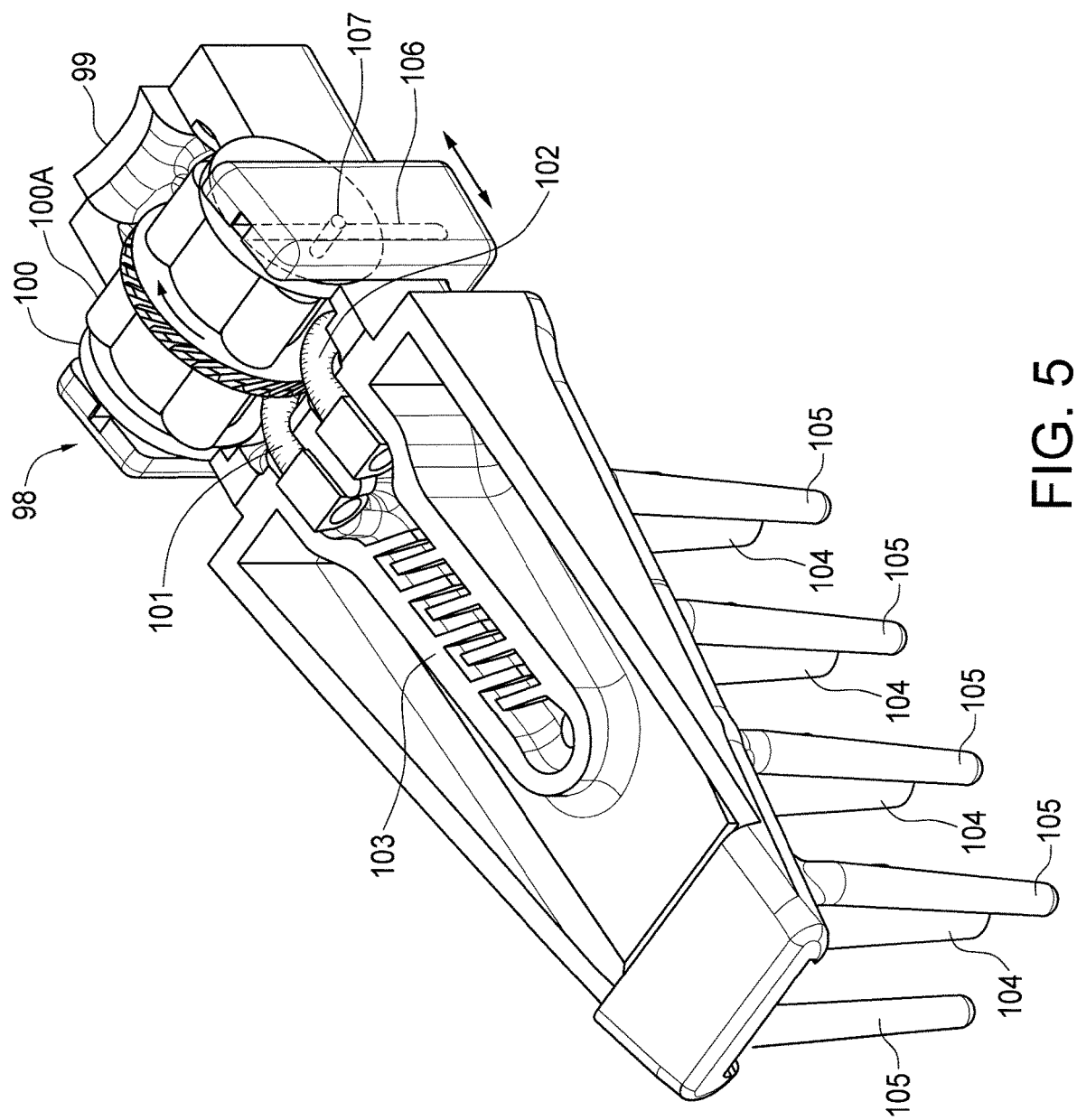
FIG. 5 is a perspective view of an alternative coloring pump/mixer arrangement.

FIG. 5 shows an alternate pump/mixer/scotch yoke arrangement, shown generally at 98. It includes a molded tube assembly 99 from the colorant and developer reservoirs, a rotor 100 and roller 101A assembly which rotates against incoming tubes 101 and 102 into the nozzle array 103 which includes a plurality of nozzles 104. The nozzles are flanked by filaments 105 in the fixed case. The nozzle array is moved by a scotch yoke which includes a yoke slot 106 and a drive pin 107 from rotor 11, operating on a shuttle 106 to move the nozzle array back and forth.

Figure 7:
FIG. 7 is a front view of the appliance in use on a user's hair.
Figure 8:
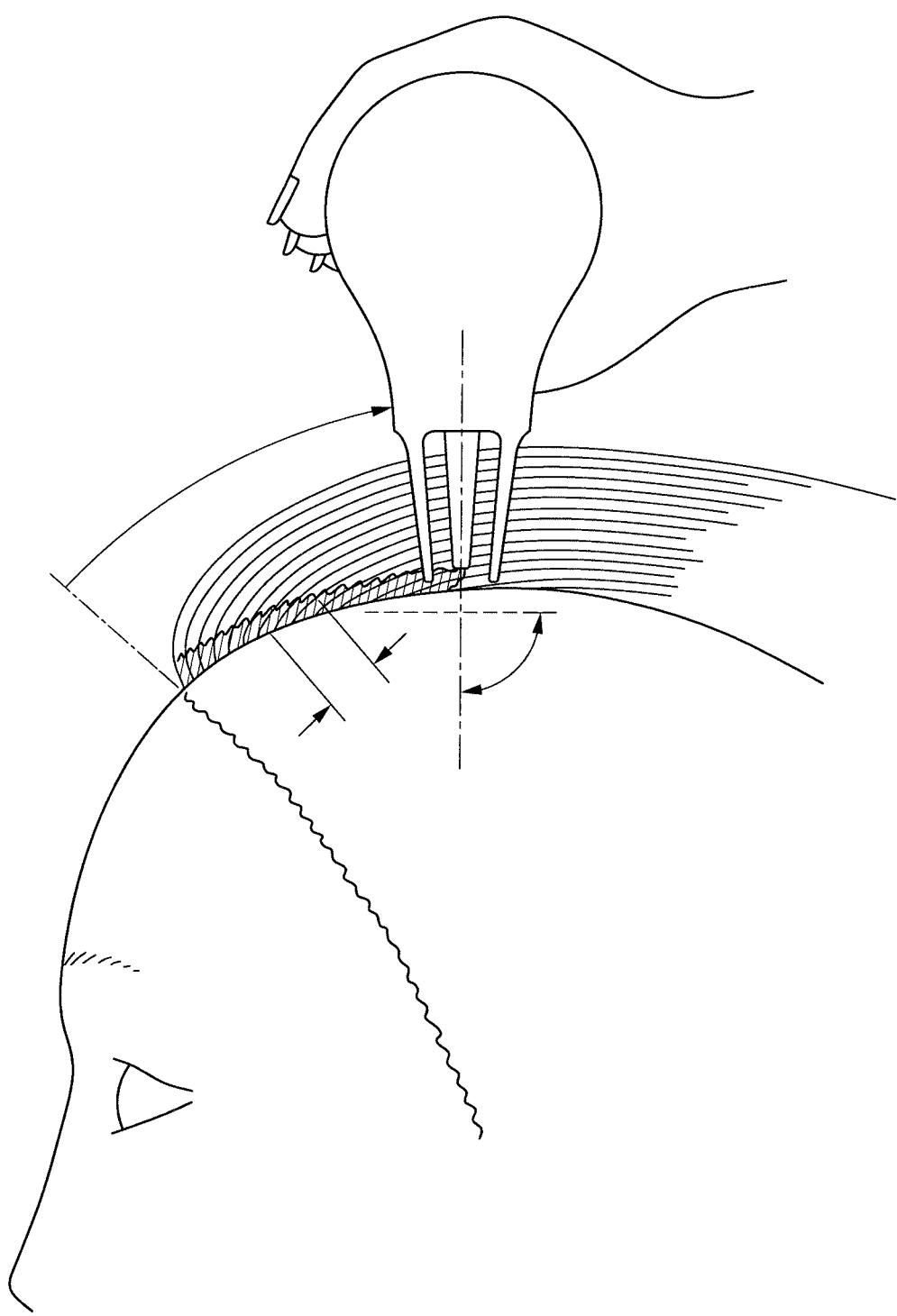
FIG. 8 is a lateral view of the appliance in use.
Figure 9:
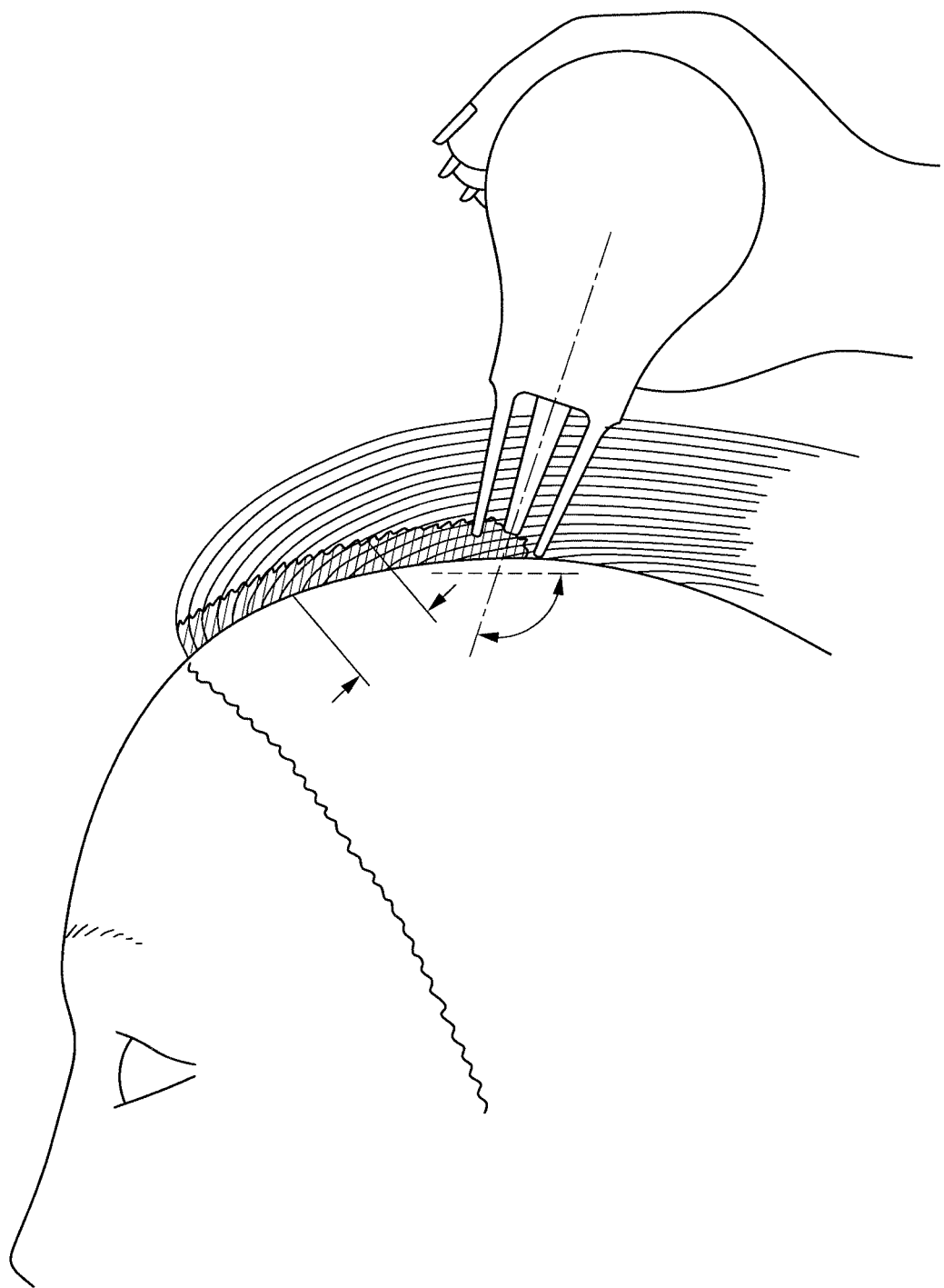
FIG. 9 is a lateral view of the appliance in use tilted off the scalp.

FIGS. 7-9 show the use of the appliance as it is drawn through the hair along the scalp from front to back to color the hair roots. The nozzle array moves from side to side with an amplitude typically within the range of approximately 5 mm to 10 mm peak to peak, preferably 10*mm* from the front edge of the scalp. The appliance is drawn along the scalp from front to the back of the head, resulting in a coloring of the hair roots to approximately 1 cm various brushing motors can be used successfully. After the initial (first) pass is made, the appliance is moved back to the front edge of the scalp and again moved along the scalp. This occurs until the entire scalp has been covered, resulting in coloration of all of the roots, usually requiring 6-8 successive passes.

In some cases, as shown in FIG. 9, the filaments are not positioned normal relative to the scalp. Typically, the user cannot be expected to keep the brushhead normal to the scalp at all times. The highest angle of acceptable error is typically 20° off normal.

Another factor impacting the length of hair colored in the roots area is the capillary action of the color mix in the hair. Capillary action of the coloring fluid increases the length of effectively colored hair at the roots. Additional length beyond the average 1 cm coverage is dependent upon the amount of material applied, which is determined by the pump rate divided by brushing speed, as well as other factors. One approximation is 20% additional length of hair colored.

A further factor influencing the length of hair that is effectively colored in the roots arrangement is the compression of the hair, pressing the hair tightly together. Generally, if the nozzles are too short, the hair is compressed and the length of treatment relative to the roots is impacted, with the entire or most of the hair length being covered instead of just the roots. Typically, in the embodiment shown, the distance from the nozzle tip to the nozzle base, i.e. the nozzle length, is approximately 0.65 inches to avoid compression of the hair, although this can be varied to some extent.

With respect further to comfort of use of the appliance, the percentage of open area between the nozzles is important. Similar to combs, the percentage of open area between successive nozzles in the embodiment shown is approximately 50%, which could be increased somewhat. The same open area requirement is true for the filaments.

The bore of the individual nozzles can also be important relative to cleanliness of use of the appliance. A low pressure drop through each nozzle is desirable to limit pump pressure requirements and also to insure that when the pump starts, residual pressure in the nozzle does not cause continual dripping of the mixed coloring material. Generally, the minimum bore diameter of the nozzles is 0.060 inches. It is also understood that the bore diameters should gradually increase along the nozzle array, with the smallest diameter being nearest the fluid entry and the largest at the other end of the nozzle array. In one embodiment, the diameter of the nozzle at the entry end is 0.065 inches, with successive nozzles being 0.070 inches, 0.075 inches and 0.080 inches in diameter. These measurements, however, can be varied depending on design applications, with the diameters chosen tending to equalize material exiting from each nozzle.

In the embodiment shown, the wall thickness using polypropylene, is generally 0.035 inches.

Finally, relative to the motion of the nozzle array, the frequency of oscillation must be sufficiently high to cause overlap in the direction of motion of the brush as it is moved through the hair. Users are typically careful in moving the brush slowly through the hair, with an average speed of 2 cm per second. In the present arrangement, a frequency of $300H_z$ has been used, although more desirable is a frequency is $400\pm40$ $H_z$. In order to achieve proper coverage, the appropriate frequency determination is brushing velocity divided by nozzle diameter. With an outer nozzle diameter in one example of 3.4 mm with a brushing velocity of 2 cm per second, 400 RPM is the resulting frequency. The frequency, however, could be higher depending upon the particular application. Generally, the lowest comfortable frequency of operation providing the desired results is selected.

Figure 6:
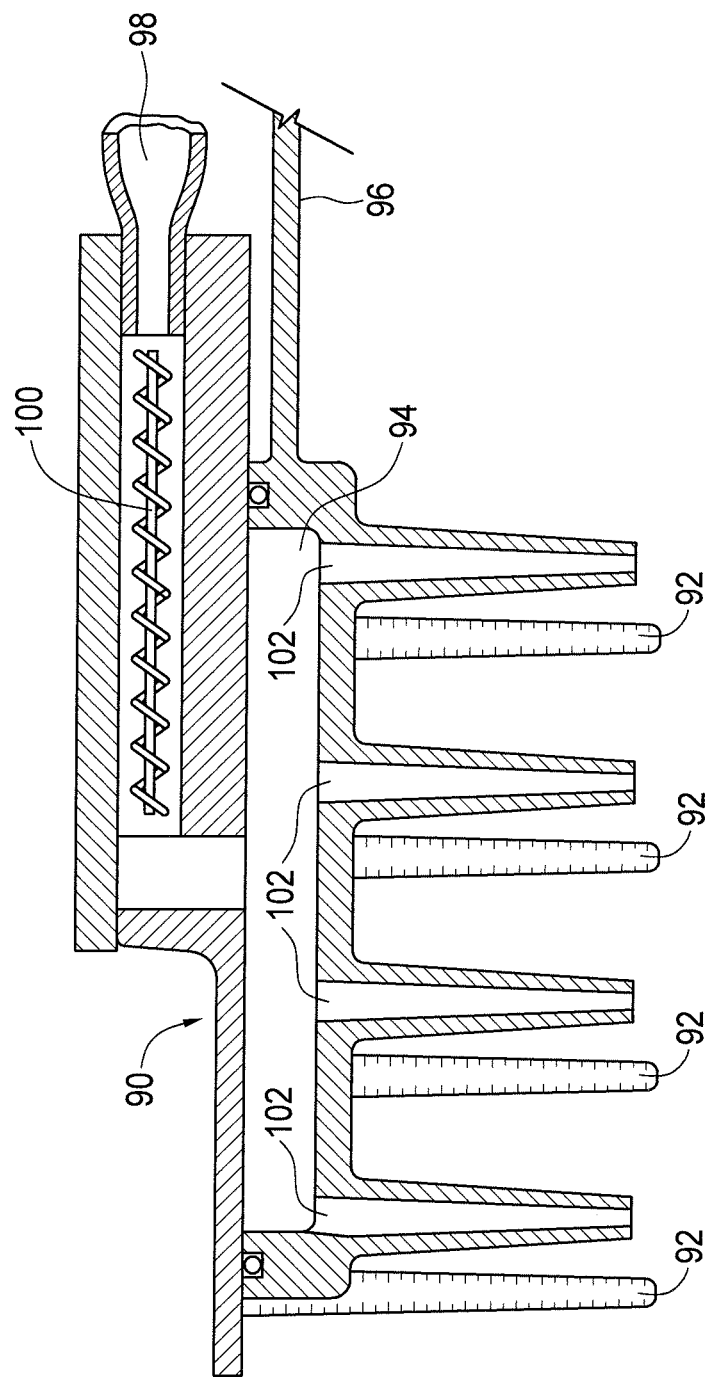
FIG. 6 is a longitudinal cross-section of an alternative nozzle assembly.

FIG. 6 shows another embodiment for the nozzle assembly. The nozzle assembly includes a stationary frame 90 from which extends a plurality of filaments, typically four filaments 92-92 on both flanking sides of a central moveable nozzle array 94, which is moved by an extension 96 from a scotch yoke. Material is provided at inlet 98 by the pump system mixed by a static mixer 100, and then provided to the several in-line nozzles through channels 102-102.

Figure 10:
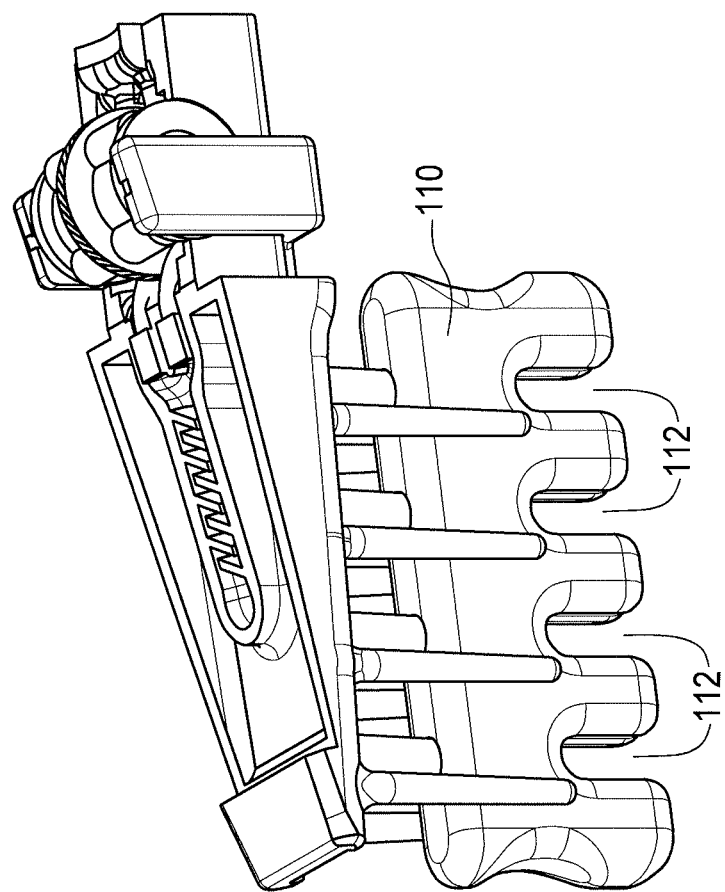
FIG. 10 is a perspective view of a nozzle assembly with an attachment for coloring hair from the roots to the ends.
Figure 11:
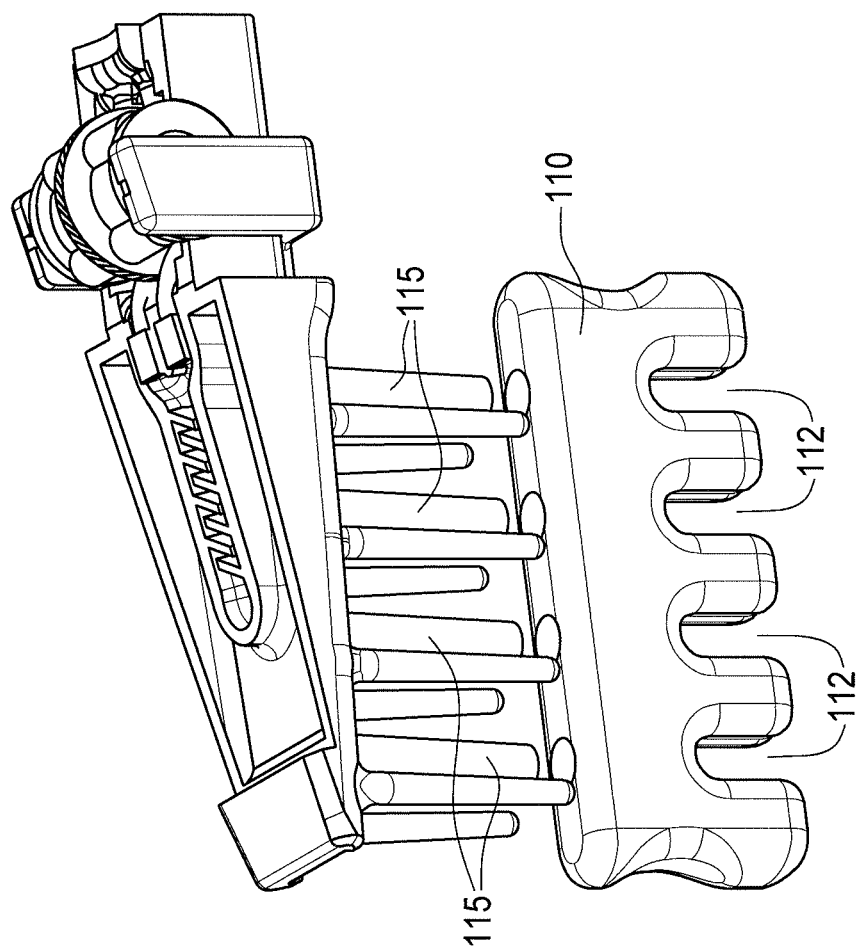
FIG. 11 is an exploded view of FIG. 10.
Figure 12:
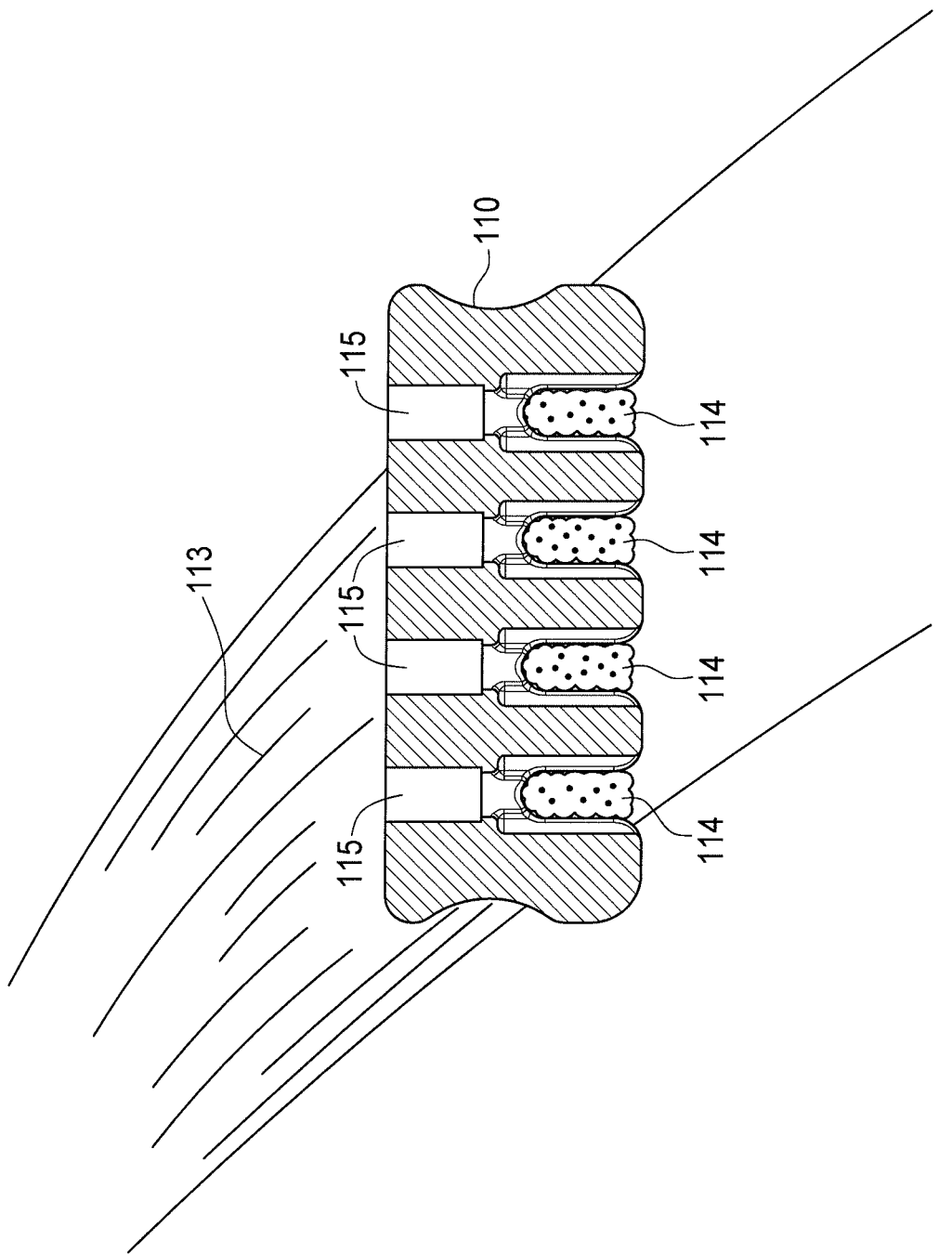
FIG. 12 is a lateral cross-sectional view of FIG. 10 showing use of the pull-through appliance on hair.

Following the coloring of the roots, the length of the hair from the roots to the termination of the hair (ends) is accomplished. This second step in hair coloring is sometimes known as pull-out. Additional material must be applied to the hair for a successful pull-out to the very ends of the hair. In the arrangement of FIGS. 10-12, the nozzles are covered by an ends attachment 110. In the embodiment shown, the ends attachment is fitted over the nozzles and held between the filaments, allowing coloring material to enter openings 112-112 between successive ends members 111-111. Openings 112-112 are 4*mm* wide with a height of 9*mm*. In operation, attachment 110 oscillates along with the nozzle array with the ends directly touching the scalp. The ends slide against the scalp, so the ends members have generous radii, i.e. approximately 1 mm. In use, the appliance with the attachment in place is pulled through the hair all the way to the ends of the hair 113. Hair color material and hair captured in the attachment openings is shown at 114.

The volume of fluid used in the embodiment shown for each packet of colorant and developer is approximately 60 cc, which can be changed. In the embodiment shown, the single pump rate flow is 10 cc per minute for the developer and 10 cc per minute for the colorant. Flow is a function of viscosity as well as other fluid factors. The formulation provided in the packets for use with the appliance is adjusted relative to the pump flow rates and so should the relative volumes of each fluid.

The appliance is capable of delivering a variety of cosmetic compositions, including hair coloring compositions, hair treatment compositions, scalp treatments compositions and hair loss treatment compositions. The compositions include, as indicated above, but are not limited to: hair treatment composition e.g., coloring, conditioner, gel, glue, mousse, pomade, serum, tonic, wax; scalp treatment compositions e.g., dandruff treatment compositions, dry scalp treatment compositions, sunscreen compositions; hair loss treatment compositions, e.g. Minoxidil compositions, including 6-Piperdin-1-ylpyrimidine-2,4-diamine 3-oxide; shampoo oil e.g. morocco oil and the like; anti-fungals, topical steroids, anti-parasitic composition, lice treatment composition and the like; seb derm, psoriasis, head lice, tinea (fungus), hair loss treatments and the like; cleansing treatments, styling treatments and conditioning treatments.

Related applications owned by the assignee of the present invention include U.S. patent applications Ser. Nos. 14/554,798, 14/572,250 and 14/586,138, the contents of which are hearby incorporated by reference.

Accordingly, the present invention includes a movable nozzle array in a static nozzle frame, with filaments flanking the line of individual nozzles in the array, the filaments being longer than the nozzles and acting as a stand-off relative to the scalp. The nozzle array moves laterally while the appliance is moved by the user along the scalp and through the hair. The appliance also includes an attachment which is adapted to color the ends of the hair.

Although a preferred embodiment of the invention has been disclosed for purposes of illustration, it should be understood that various changes, modifications and substitutions may be incorporated in the embodiment without departing from the spirit of the invention which is defined by the claims which are:

What is claimed is:

1. An appliance, comprising:
    a handle;
    a cosmetic composition delivery system, supported within the handle;
    a nozzle assembly for receiving a cosmetic composition from the cosmetic composition delivery system, wherein the nozzle assembly includes a stationary nozzle base, an associated nozzle array supported for movement within the nozzle base, the nozzle array including a plurality of nozzles through which the received cosmetic composition is delivered therefrom and a plurality of stationary filaments extending from the stationary nozzle base in the same direction as the nozzle array, wherein the nozzles are in line with filaments on at least one flanking side of each nozzle; and
    a motor connected to the nozzle array for moving the entire nozzle array, reciprocating the nozzle array back and forth from side to side, relative to the nozzle base and filaments which remain stationary, delivering the cosmetic composition as the appliance is pulled through the hair of a user.

2. The appliance of claim 1, wherein the plurality of filaments are positioned adjacent to the nozzle array which act as a stand-off between the nozzle array and the scalp.

3. The appliance of claim 2, wherein the stand-off between the filaments and the nozzles is at least 0.05 inches.

4. The appliance of claim 1, wherein the cosmetic composition delivery system comprises a hair color composition delivery system; and wherein the motor is configured to deliver the hair cosmetic composition as the appliance is pulled through the hair by the user.

5. The appliance of claim 4, wherein the nozzle movement has an amplitude at least as great as center-to-center nozzle spacing.

6. The appliance of claim 4, including an attachment member positionable on the nozzle array, extending below the nozzles and having shaped end members and openings therebetween which are in fluid communication with the nozzles, as hair is passed through the openings from the roots to the ends thereof.

7. The appliance of claim 6, wherein lower ends of the end members are curved for comfortable contact with the scalp.

8. The appliance of claim 1, wherein the cosmetic composition delivery system includes one or more reservoirs for at least one of a hair treatment composition, scalp treatment composition, hair loss treatment composition and hair coloring composition.

9. The appliance of claim 1, wherein the nozzles are in line with filaments on both flanking sides thereof.

10. The appliance of claim 9, wherein the nozzle array includes four spaced nozzles and four spaced filaments on flanking sides thereof.

11. The appliance of claim 1, wherein the coverage of the hair color is approximately 1 cm, for hair roots.

12. The appliance of claim 11, wherein capillary action of the cosmetic composition occurs in the hair as the nozzle array is moved through the hair, increasing the length of hair colored at the roots.

13. The appliance of claim 1, wherein the nozzles are at least 0.65 inches long.

14. The appliance of claim 1, wherein the nozzles are spaced 0.4 inches apart.

15. The appliance of claim 1, including an open area in the range of 40-50% between adjacent nozzles.

16. The appliance of claim 1, wherein the nozzles have a diameter of at least 0.040 inches.

17. The appliance of claim 16, wherein the diameter of successive nozzles increases from the nozzle at a point of entry of the hair color composition to the nozzle array.

18. The appliance of claim 1, wherein the frequency of oscillation of the nozzle array is 400 $H_z$ plus or minus 40 $H_z$ and wherein side to side movement of the array is 5 mm to 10 mm peak to peak.

19. The appliance of claim 1, wherein the nozzle array is moved by an extension from a scotch yoke, and wherein cosmetic material is provided at an inlet to the nozzle assembly by a pump element, mixed by a static mixer and then directed to the nozzles in the nozzle array.

20. The appliance of claim 1, wherein all of the filaments are stationary.

* * * * *